(12) United States Patent
Concannon et al.

(10) Patent No.: US 11,271,392 B2
(45) Date of Patent: Mar. 8, 2022

(54) PROTECTION CIRCUIT FOR SIGNAL PROCESSOR

(71) Applicant: Texas Instruments Incorporated, Dallas, TX (US)

(72) Inventors: Ann Margaret Concannon, Palo Alto, CA (US); Vishwanath Joshi, Richardson, TX (US); Antonio Gallerano, San Jose, CA (US); Zhao Gao, Dallas, TX (US); Yanqing Li, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 200 days.

(21) Appl. No.: 16/558,867

(22) Filed: Sep. 3, 2019

(65) Prior Publication Data

US 2020/0235571 A1 Jul. 23, 2020

Related U.S. Application Data

(60) Provisional application No. 62/793,642, filed on Jan. 17, 2019.

(51) Int. Cl.
*H02H 9/04* (2006.01)
*H03H 11/02* (2006.01)

(52) U.S. Cl.
CPC .............. *H02H 9/04* (2013.01); *H03H 11/02* (2013.01)

(58) Field of Classification Search
CPC ........... H02H 9/04; H02H 9/046; H03H 11/02

USPC .......................................................... 361/56
See application file for complete search history.

(56) References Cited

U.S. PATENT DOCUMENTS

| 2002/0109153 A1* | 8/2002 | Ker ...................... H01L 29/7391 |
| | | 257/199 |
| 2006/0132996 A1* | 6/2006 | Poulton ............... H01L 27/0255 |
| | | 361/56 |
| 2007/0058308 A1* | 3/2007 | Thijs ....................... H03F 3/191 |
| | | 361/56 |
| 2009/0296293 A1* | 12/2009 | Ker ...................... H01L 27/0251 |
| | | 361/56 |
| 2016/0218503 A1* | 7/2016 | La Rosa ............. H01L 27/0255 |
| 2017/0338219 A1* | 11/2017 | Choi ................... H01L 23/5286 |
| 2018/0182749 A1* | 6/2018 | Dai ..................... H01L 27/0285 |
| 2019/0214378 A1* | 7/2019 | Franck .................. H02H 9/046 |

* cited by examiner

*Primary Examiner* — Dharti H Patel
(74) *Attorney, Agent, or Firm* — Andrew R. Ralston; Charles A. Brill; Frank D. Cimino

(57) ABSTRACT

A protection circuit for a signal processor, a method of operating the protection circuit, and a method of forming the protection circuit. In one example, the protection circuit is couplable to a signal port and a first power bus for the signal processor. The protection circuit includes a first diode string couplable across the signal port and the first power bus. The first diode string includes a first diode and a second diode coupled in series in a same polarity sense. The protection circuit also includes a third diode coupled in parallel with one of the first diode and the second diode in an opposite polarity sense.

19 Claims, 5 Drawing Sheets

PROTECTION CIRCUIT FOR SIGNAL PROCESSOR

This application claims the benefit of U.S. Provisional Patent Application No. 62/793,642, entitled "Technique to Improve Linearity of ESD Scheme to Minimize Unwanted Harmonic Distortion in the Presence of RF Interference at the IO Pin," filed Jan. 17, 2019, which is incorporated herein by reference.

TECHNICAL FIELD

The present disclosure is directed, in general, to signal processing circuits. More specifically, it is directed to a protection circuit for a signal processor, a method of operating that protection circuit, and a method of forming that protection circuit.

BACKGROUND

Signal processing circuits (also referred to as "signal processors") are any number or class of circuits that accept one or more input electrical signals and produce a corresponding output electrical signal in response to the input signal(s). The signal processors are interconnected to perform a variety of functions such as, control motors, actuators, memory read and write operations, internet data transportation, and peripheral device management.

The input and output ("I/O") signal ports of the signal processors are interconnected via electrical conductor(s) constructed via a number of methods such as, etched conductive traces on a monolithic semiconductor substrate, printed conductive traces on a non-conductive substrate, conductive cables constructed for the purpose of transporting electrical signals, or individual conductors (or semiconductor components) arranged for the purpose. Indeed, there are numerous, widely-utilized standardized "data bus" methods that facilitate the transporting of electrical signals, for example, I²C, ethernet, universal serial bus ("USB"), peripheral component interconnect ("PCI"), and control area network ("CAN") buses. These I/O signal ports and the interconnected data buses are susceptible to extraneous sources of unwanted signals, such as induced electro-magnetic interference ("EMI"), electrostatic discharge ("ESD"), and electro-magnetic pulses ("EMP") that can damage and/or otherwise render the signal processors inoperative or compromise the integrity of the electrical signals.

Accordingly, what is needed is a protection circuit, a related method of operating the protection circuit, and a method of forming the protection circuit, that reduces, if not removes, the effects from extraneous sources of unwanted signals.

SUMMARY OF THE DISCLOSURE

These and other problems are generally solved or circumvented, and technical advantages are generally achieved, by advantageous examples of the present disclosure which includes a protection circuit for a signal processor, a method of operating the protection circuit, and a method of forming the protection circuit. The protection circuit is couplable to a signal port and a first power bus for the signal processor and the protection circuit includes a first diode string couplable across the signal port and the first power bus. The first diode string includes a first diode and a second diode coupled in series in a same polarity sense. The protection circuit also includes a third diode coupled in parallel with one of the first diode and the second diode in an opposite polarity sense.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated that the specific examples disclosed may be readily utilized as a basis for modifying or designing other structures or processes for carrying out the same purposes of the present disclosure. It should also be realized that such equivalent constructions do not depart from the spirit and scope of the disclosure as set forth in the appended claims.

BRIEF DESCRIPTION OF THE DRAWINGS

For a more complete understanding of the present disclosure, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred examples and are not necessarily drawn to scale.

DETAILED DESCRIPTION

The present disclosure will be described with respect to examples in a specific context, namely, a protection circuit for a signal processor, a method of operating the protection circuit, and a method of forming the protection circuit. The principles of the present disclosure, however, may also be applied to all types of circuits that may benefit from a protection circuit that reduces, if not removes, the effects from the extraneous sources of unwanted signals.

Figure 1:
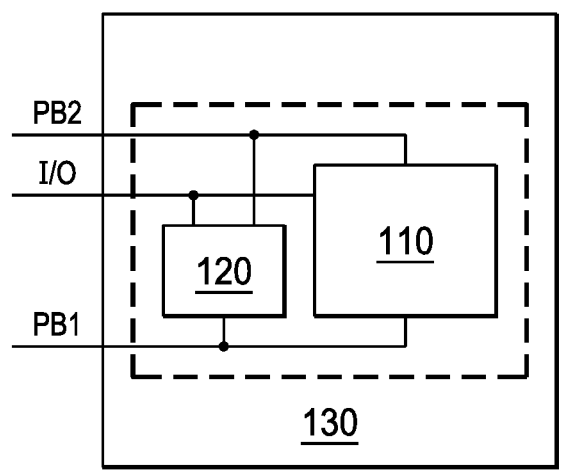
FIG. 1 illustrates a block diagram of a top view of an example of a signal processor with a protection circuit on a substrate.

Referring initially to FIG. 1, illustrated is a block diagram of an example signal processor 110 (e.g., an amplifier or other logic circuit) with a protection circuit 120 (e.g., an electrostatic discharge circuit) on a substrate 130 (e.g., a monolithic semiconductor substrate). The dotted box around the signal processor 110 and the protection circuit 120 indicates that the protection circuit 120 can be integrated therewith or be a separate component from the signal processor 110 on the substrate 130. The signal processor 110 and the protection circuit 120 are coupled to power buses PB1, PB2 that provide electrical energy (or grounding) for the signal processor 110. A signal port such as an input/output port (designated I/O) is also coupled to the signal processor 110 and the protection circuit 120.

The protection circuit 120 is configured to clamp a voltage on the signal port I/O to one or both of the power/ground buses PB1, PB2. The protection circuit 120 is also configured to reduce a variation of a non-linear capacitive impedance presented to the signal port I/O. As a result, protection circuit 120 reduces, if not removes, the effects of extraneous sources of unwanted signals for the signal processor 110. The protection circuit 120 may be constructed on the same substrate 130 as the signal processor 110 (and be integrated therewith) or the protection circuit 120 may be a separate discrete component embodied on a separate substrate from the signal processor 110.

A common method of providing protection against damaging signals is to provide dual series diodes on signal ports to divert the potentially damaging current into and out of the first and second power/ground buses. Such diodes are commonly reverse biased during normal circuit operation and therefore provide a capacitive impedance that is non-linearly dependent on the voltage of the signal port relative to the first or second power/ground bus. The signals incident on the signal port are reflected with harmonic distortion due to the aforementioned non-linear impedance causing unwanted disturbance to the circuitry in the signal processor and thereby reducing the integrity of the desired electrical signal. Impedance matching through the addition of inductive impedance can compensate for both the non-linear capacitive impedance and any extraneous EMI signals, but this necessitates expensive and space inefficient discrete or printed spiral inductors resident on the data bus (either on the same monolithic semiconductor substrate as the signal processor or on the same physical data bus substrate or cable termination points).

Figure 2:
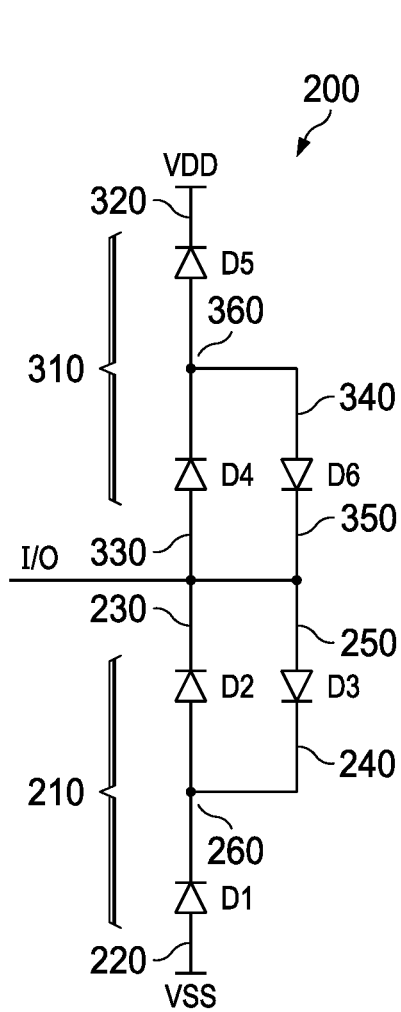
FIGS. 2 and 3 illustrate schematic diagrams of examples of protection circuits.
Figure 3:
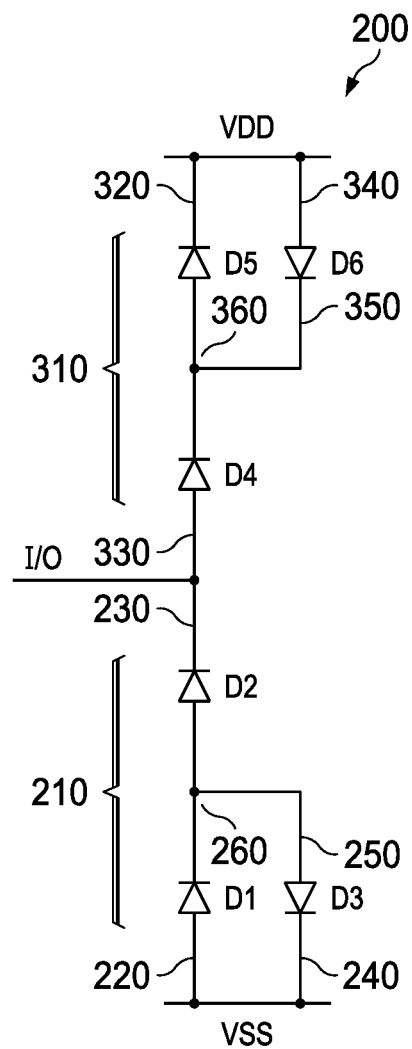

Turning now to FIGS. 2 and 3, illustrated are schematic diagrams of examples of a protection circuit 200. The protection circuit 200 is couplable to a signal port I/O (e.g., an input/output port) and a first power bus VSS for a signal processor (see, for instance, the signal processor 110 of FIG. 1). The first power bus VSS may be a ground voltage, a positive voltage, or a negative voltage. The protection circuit 200 includes a first diode string 210 couplable across the signal port I/O and the first power bus VSS. Thus, a first end 220 of the first diode string 210 is couplable to the first power bus VSS and a second end 230 of the first diode string 210 is couplable to the signal port I/O. The first diode string 210 includes a first diode D1 and a second diode D2 coupled in series in a same polarity sense (e.g., the same anode-cathode orientation). The protection circuit 200 also includes a third diode D3 coupled in parallel with one of the first diode D1 and the second diode D2 in an opposite polarity sense (e.g., an opposite anode-cathode orientation with respect to the first diode D1 and the second diode D2). Therefore the third diode D3 is called "anti-parallel diode" D3 infra.

In the example illustrated in FIG. 2, the third diode D3 is coupled in parallel with the second diode D2. The third diode D3 has a first terminal 240 coupled to a common terminal 260 between the first diode D1 and the second diode D2 of the first diode string 210, and a second terminal 250 couplable to the signal bus I/O (e.g., the second terminal 250 of the third diode D3 is coupled to the second end 230 of the first diode string 210).

In FIG. 3, the third diode D3 is coupled in parallel with the first diode D1 with the first terminal 240 couplable to the first power bus VSS (e.g., the first terminal 240 of the third diode D3 is coupled to the first end 220 of the first diode string 210) and the second terminal 250 coupled to the common terminal 260 between the first diode D1 and the second diode D2 of the first diode string 210. With continuing reference to FIG. 1, the first diode string 210 and the third diode D3 may be located on the monolithic semiconductor substrate 130.

The protection circuit 200 also includes a second diode string 310 couplable across the signal port I/O and a second power bus VDD for the signal processor (again, for instance, the signal processor 110 of FIG. 1). The first power bus VSS is at a first voltage, the second power bus VDD is at a second voltage, and the signal port I/O is at a nominal voltage therebetween. Also, a first end 320 of the second diode string 310 is couplable to the second power bus VDD and a second end 330 of the second diode string 310 is couplable to the signal port I/O. The second diode string 310 includes a fourth diode D4 and a fifth diode D5 coupled in series in a same polarity sense (e.g., the same anode-cathode orientation). The protection circuit 200 also includes a sixth diode D6 coupled in parallel with one of the fourth diode D4 and the fifth diode D5 in an opposite polarity sense (e.g., an opposite anode-cathode orientation with respect to the fourth diode D4 and the fifth diode D5). Therefore the sixth diode D6 is called "anti-parallel diode" D6 infra.

In FIG. 2, the sixth diode D6 is coupled in parallel with the fourth diode D4 with a first terminal 340 coupled to a common terminal 360 between the fourth diode D4 and the fifth diode D5 of the second diode string 310 and a second terminal 350 couplable to the signal port I/O (e.g., the second terminal 350 of the sixth diode D6 is coupled to the second end 330 of the second diode string 310).

In FIG. 3, the sixth diode D6 is coupled in parallel with the fifth diode D5 with a first terminal 340 couplable to the second power bus VDD (e.g., the first terminal 340 of the sixth diode D6 is coupled to the first end 320 of the second diode string 310) and a second terminal 350 coupled to a common terminal 360 between the fourth diode D4 and the fifth diode D5 of the second diode string 310. With continuing reference to FIG. 1, the first diode string 210, the third diode D3, the second diode string 310 and the sixth diode D6 may be located on the monolithic semiconductor substrate 130.

During a normal operations, the electrical signal on the signal port I/O is limited to a voltage between the first power bus VSS and the second power bus VDD (corrected for the forward voltage drop (e.g., about 0.7 volts per diode) across the first and second diodes D1, D2 of the first diode string 210 and the fourth and fifth diodes D4, D5 of the second diode string 310). Also, during the normal operations, the first and second diodes D1, D2 of the first diode string 210 and the fourth and fifth diodes D4, D5 of the second diode string 310 are reverse biased.

Any transient or external electrical signal (such as the electrostatic discharge event causing the voltage on the signal port I/O to fall below the voltage of the first power bus VSS) will cause the first and second diodes D1, D2 of the first diode string 210 to be forward biased and conduct that energy through the first power bus VSS (thereby clamping the voltage at the signal port I/O to a magnitude equal to the voltage of the first power bus VSS plus a forward voltage drop of the first and second diodes D1, D2). Additionally, any transient or external electrical signal (such as the electrostatic discharge event causing the voltage on the signal port I/O to exceed the voltage on second power bus VDD) will cause the fourth and fifth diodes D4, D5 of the second diode string 310 to be forward biased and conduct that energy through the second power bus VDD (thereby clamping the voltage at the signal port I/O to a magnitude equal to the voltage of the second power bus VDD plus a forward voltage drop of the fourth and fifth diodes D4, D5).

Each of the diodes of the first and second diode strings 210, 310 exhibit a capacitive impedance characteristic that varies with applied reverse voltage. As the magnitude of the electrical signal on the signal port I/O varies with time relative to the magnitude of the first and second power buses VSS, VDD, the capacitive impedance will vary (i.e. inversely proportional to a factor of the square root of the applied reverse bias voltage). This non-linear capacitive impedance creates harmonic distortion of the electrical signal and in turn causes disturbance to the operation of the signal processor 110. An inductor may be placed in series with the signal port I/O, and/or an inductor plus a series resistor may be coupled across (in parallel with) the first and/or second diode strings 210, 310 to provide some inductive impedance offset, albeit with the addition of the inductive component(s) to the protection circuit 200.

The protection circuit 200 as described herein incorporates the third diode D3 and/or the sixth diode D6 to address the non-linear capacitive impedance presented to the signal port I/O. With respect to FIG. 2 and the first and second diode strings 210, 310 during a normal operations, the third and sixth diodes D3, D6 remain forward biased but non-conductive due to the current blocking action of the reverse biased first and fifth diodes D1, D5, respectively. As the magnitude of the electronic signal on the signal port I/O varies with time relative to the magnitude of the first and second power buses VSS, VDD, the capacitive impedance of the third and sixth diodes D3, D6 will vary (i.e. directly proportional to a factor of the natural logarithm base "e" raised to the power of the forward biased voltage). This non-linear capacitive impedance variation is in the opposite direction to the reverse biased capacitive impedance variation of the first, second, fourth and fifth diodes D1, D2, D4, D5 and tends to reduce the overall non-linear capacitive impedance presented to the signal port I/O. This lower non-linear capacitive impedance reduces the harmonic distortion of the electronic signal and in turn contributes less disturbance to the proper operation of the signal processor (element 110 of FIG. 1).

With respect to FIG. 3 and the first and second diode strings 210, 310 during a normal operation, the third and sixth diodes D3, D6 remain forward biased but non-conductive due to the current blocking action of the reverse biased second and fourth diodes D2, D4, respectively. As the magnitude of the electronic signal on the signal port I/O varies with time relative to the magnitude of the first and second power buses VSS, VDD, the capacitive impedance of the third and sixth diodes D3, D6 will vary (i.e. directly proportional to a factor of the natural logarithm base "e" raised to the power of the forward biased voltage). This non-linear capacitive impedance variation is in the opposite direction to the reverse biased capacitive impedance variation of the first, second, fourth and fifth diodes D1, D2, D4, D5 and tends to reduce the overall non-linear capacitive impedance presented to the signal port I/O. This lower non-linear capacitive impedance reduces the harmonic distortion of the electronic signal and thereby contributes less disturbance to the proper operation of the signal processor (element 110 of FIG. 1).

The protection circuit 200 can improve the linearity of the electrostatic discharge to reduce unwanted distortion in the presence of radio frequency ("RF") interference at the signal port I/O. The RF signals incident on the signal port I/O get reflected with harmonic distortion due to the voltage dependent impedance (capacitive) that may cause a disturbance to the signal processor and/or external circuitry. The protection circuit 200 reduces the harmonic distortion by lowering the input capacitance sensitivity to the signal port I/O voltage variations without imposing limitations on diode size or additional circuit elements in the electrostatic discharge path. The protection circuit 200 incorporates a diode string and anti-parallel diode without incorporating extraneous on-chip compensating passive components like spiral inductors. The anti-parallel diode (third and sixth diodes D3, D6) produces a lower junction capacitance dependence on the applied signal. The capacitance of the anti-parallel diodes have an overall weaker dependence on the voltage of the signal port I/O because any change in voltage ("dV") produces a change in capacitance ("dC") of opposite sign.

Thus, the first diode string 210 is configured to clamp a voltage between the signal port I/O and the first power bus VSS (again, taking into account the voltage drop across the first and second diodes D1, D2). The third diode D3 is configured to reduce a variation of a non-linear capacitive impedance presented to the signal port I/O. The second diode string 310 is configured to clamp a voltage between the signal port I/O and the second power bus VDD (again, taking into account the voltage drop across the fourth and fifth diodes D4, D5). The sixth diode D6 is configured to reduce a variation of a non-linear capacitive impedance presented to the signal port I/O. Also, the designation of the power buses and diodes (and diode strings) is for illustrative purposes only, and such designators and/or reference numbers may apply to other components associated with the protection circuit 200. For instance, the second diode string 310 may be referred to as the first diode string 210, and vice versa, and/or the second power bus VDD may be referred to as the first power bus VSS and vice versa.

Figure 4:
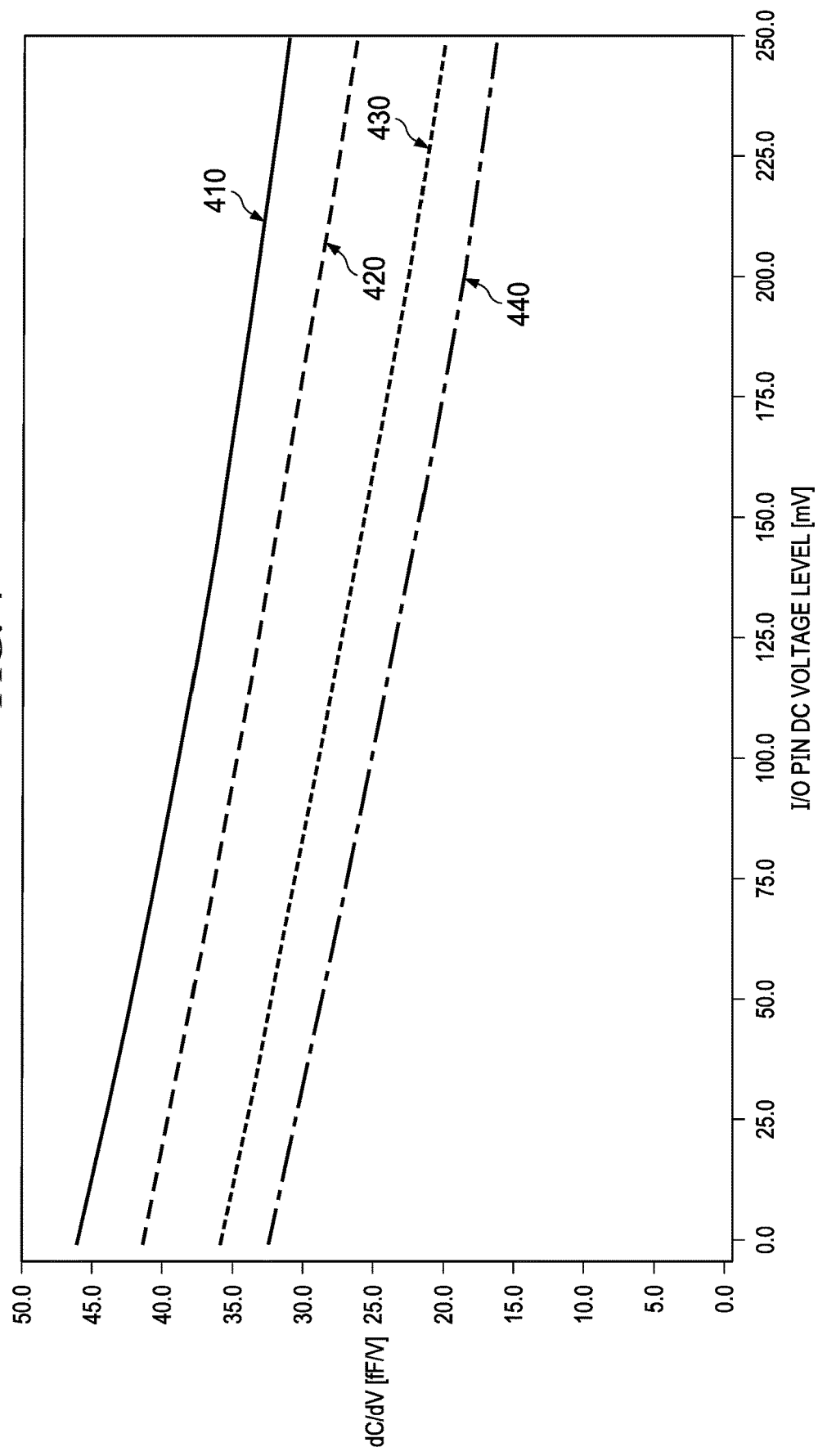
FIGS. 4 and 5 illustrate graphical representations demonstrating variations of non-linear capacitance as a function of an applied voltage at a signal port.

Turning now to FIG. 4, illustrated is a graphical representation demonstrating a variation of non-linear capacitance ("dC/dV") as a function of an applied voltage ("mV") at the signal port. A first plotline 410 represents the combined effective non-linear capacitive impedance at the signal port for conventional diode strings coupled across (and/or "connected between") the signal port and the respective power buses. With continuing reference to FIG. 2 and a second power bus voltage VDD of 3.3 volts ("V"), a second plotline 420 represents the combined effective non-linear capacitive impedance at the signal port for the protection circuit 200 with the anti-parallel diodes (the third and sixth diodes D3, D6) constructed with a junction area of 100 square microns. A third plotline 430 represents the combined effective non-linear capacitive impedance at the signal port for the protection circuit 200 with the anti-parallel diodes (the third and sixth diodes D3, D6) constructed with a junction area of 153 square microns. A fourth plotline 440 represents the combined effective non-linear capacitive impedance at the signal port for the protection circuit 200 with the anti-parallel diodes (the third and sixth diodes D3, D6) constructed with a junction area of 200 square microns.

In addition to the benefits exhibited between the first plotline (410) and the second through the fourth plotlines (420, 430, 440), as the junction area of the anti-parallel diode(s) is increased, the resulting combined effective non-linear capacitive impedance at the signal port is reduced. This is a direct result of the junction capacitance dependence on bias voltage (namely, the reverse biased inversely proportional capacitance variation combined with the forward biased directly proportional capacitance variation). The choice of anti-parallel diode junction area relative to the diodes in the coupled diode string(s) may be selected in accordance with system design rules and objectives.

As an example with continuing reference to FIG. 2, the protection circuit disclosed herein reduces the change in capacitance to the change in voltage ("dC/dV") by an amount that is about proportional to the value of the anti-parallel diode area (the third diode D3 and the sixth diode D6). Assuming that D1/D5 and D2/D4 are 230 square microns and 153 square microns, respectively, the dC/dV is reduced by about 21 percent ("%") (with the third diode and sixth diode D3, D6 sized at 153 micron squared with the voltage at the signal port at zero and the voltage on the second power bus VDD set at 3.3 volts). This is a consequence of the junction capacitance dependence on bias as set forth below:

$$C_{REV} \propto \frac{1}{\sqrt{1+V}}\left(\frac{dC}{dV}<0\right), C_{FWD} \propto e^{\frac{V}{2VT}}\left(\frac{dC}{dV}>0\right).$$

Figure 5:
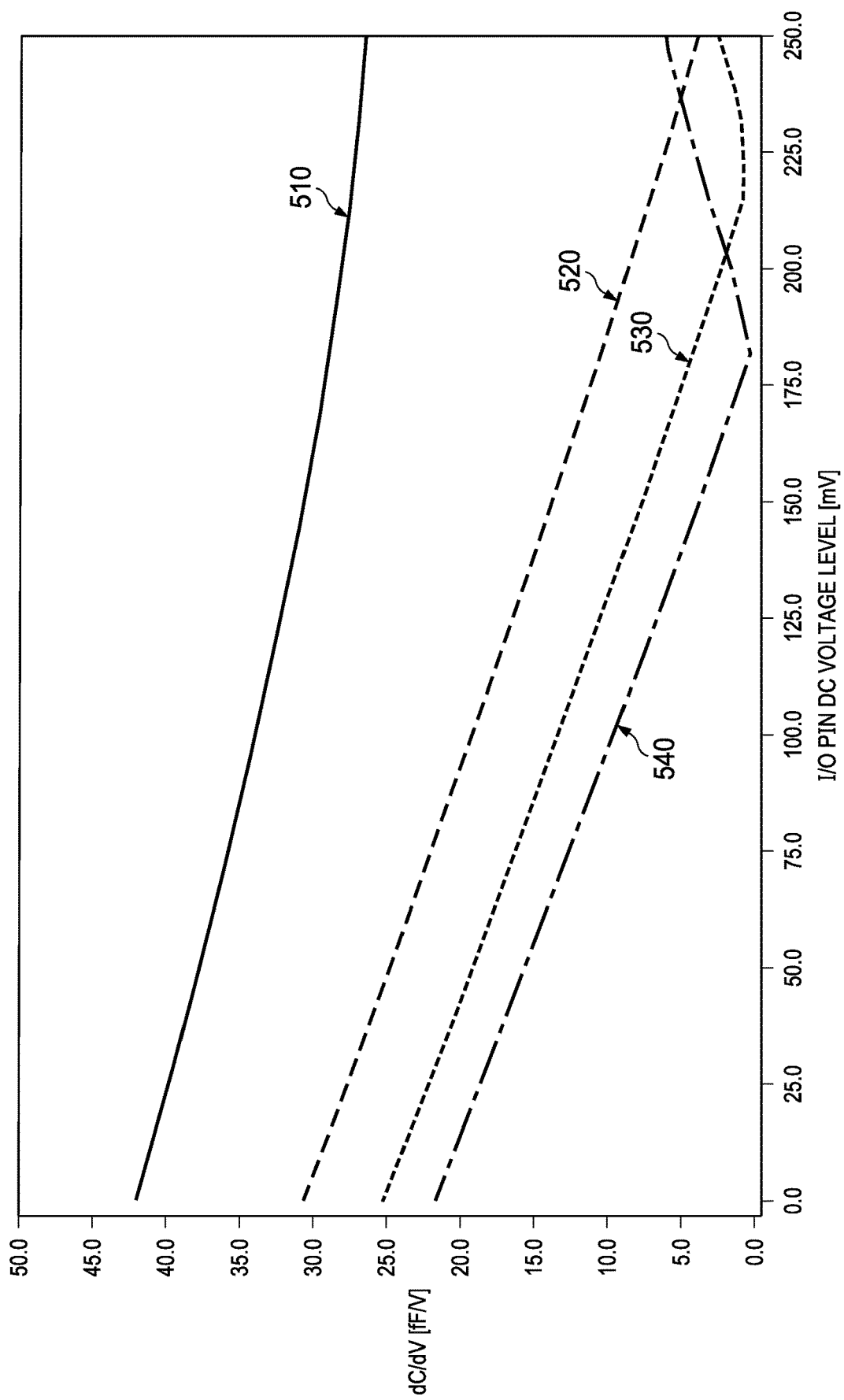

Turning now to FIG. 5, illustrated is a graphical representation demonstrating a variation of non-linear capacitance ("dC/dV") as a function of an applied voltage ("mV") at the signal port. A first plotline 510 represents dC/dV for conventional diode strings coupled across (and/or "connected between") the signal port and the respective power buses. With continuing reference to FIG. 2 and a second power bus voltage VDD of 0 volts ("V"), a second plotline 520 represents dC/dV for the protection circuit 200 with the anti-parallel diodes (the third and sixth diodes D3, D6) constructed with a junction area of 100 square microns. A third plotline 530 represents dC/dV for the protection circuit 200 with the anti-parallel diodes (the third and sixth diodes D3, D6) constructed with a junction area of 153 square microns. A fourth plotline 540 represents dC/dV for the protection circuit 200 with the anti-parallel diodes (the third and sixth diodes D3, D6) constructed with a junction area of 200 square microns.

In addition to the benefits exhibited between the first plotline 510 and the second, third and fourth plotlines (520, 530, 540), as the junction area of the anti-parallel diode(s) is increased, the resulting combined effective non-linear capacitive impedance at the signal port is reduced. This is a direct result of the junction capacitance dependence on bias voltage (namely, the reverse biased inversely proportional capacitance variation combined with the forward biased directly proportional capacitance variation). The choice of anti-parallel diode junction area relative to the diodes in the coupled diode string(s) may be selected in accordance with system design rules and objectives.

As an example with continuing reference to FIG. 2, assuming that D1/D5 and D2/D4 are 230 square microns and 153 square microns, respectively, the dC/dV is reduced by about 40 percent ("%") (with the third diode and sixth diode D3, D6 sized at 153 micron squared with the voltage at the signal port at zero and the voltage on the second power bus VDD set at 0 volts (unpowered)). This is a consequence of the junction capacitance dependence on bias as set forth in the equation supra.

Thus, the capacitive impedance of the anti-parallel diode has a voltage dependent characteristic of opposite sign than the diodes of the diode strings; providing substantial compensation for the electrostatic discharge ("ESD") capacitive impedance, and providing for a reduced harmonic distortion of the signals on the signal ports. As discussed supra, the anti-parallel diode is constructed with a circuit area equal to the corresponding ESD diode to provide a greater than a 21% reduction in the overall voltage dependent capacitive impedance.

The protective circuit 200 reduces harmonic distortion at the signal port by reducing the non-linear capacitance variation with the voltage variation at the signal port. As introduced herein, low harmonic distortion can be achieved at the signal port while maintaining suitable ESD protection afforded by the dual series diode technique. Therefore, inductive impedance-matching or compensation achieved through the implementation of inductors for the purpose of mitigating non-linear capacitance induced harmonic distortion are not necessary. However, inductive impedance devices may be retained to provide a further level of immunity from induced EMI signals. Moreover, the anti-parallel diodes do not need to be sized to conduct any ESD induced currents as the anti-parallel diodes are configured to be reverse biased during any ESD protection event.

Figure 6:
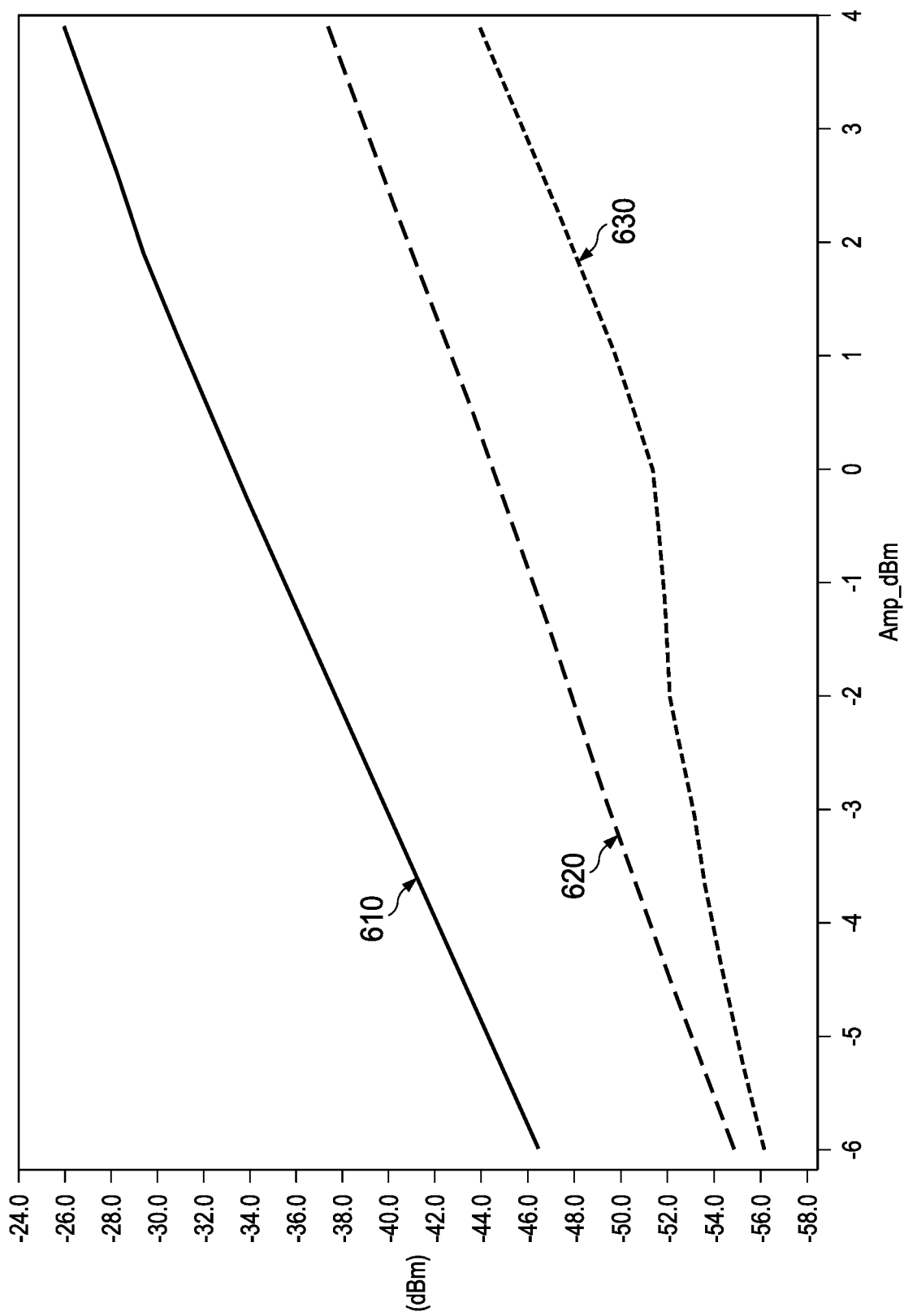
FIG. 6 illustrates a graphical representation demonstrating a reduction of harmonic distortion as a function of an input power at a signal port.

Turning now to FIG. 6, illustrated is a graphical representation of the reduction of harmonic distortion as a function of an input power (dBm) at the signal port. The horizontal axis represents power of the input signal (in dBm) at the frequency of one gigahertz with a zero voltage DC level, and the power bus VDD biased at five volts. The vertical axis provides the power (in dBm) of the second harmonic, which represents the harmonic distortion from the non-linear impedance from the diodes. As indicated, the harmonic distortion increases with an increase of the input power at the signal port. The first plotline 610 illustrates the harmonic distortion with a conventional single diode coupled across (connected between) the signal port and the respective power buses. The second plotline 620 illustrates the harmonic distortion with a conventional diode string of two diodes of the same polarity sense coupled across (connected between) the signal port and the respective power buses. The third plotline 630 illustrates the harmonic distortion with a diode string of two diodes of the same polarity sense plus an anti-parallel diode (such as FIGS. 2 and 3) coupled across (connected between) the signal port and the respective power buses. The indicated by the third plotline 630, the diode string of two diodes of the same polarity sense plus an anti-parallel diode coupled across (connected between) the signal port and the respective power buses provides a noticeable reduction in the harmonic distortion from the non-linear impedance from the diodes.

Figure 7:
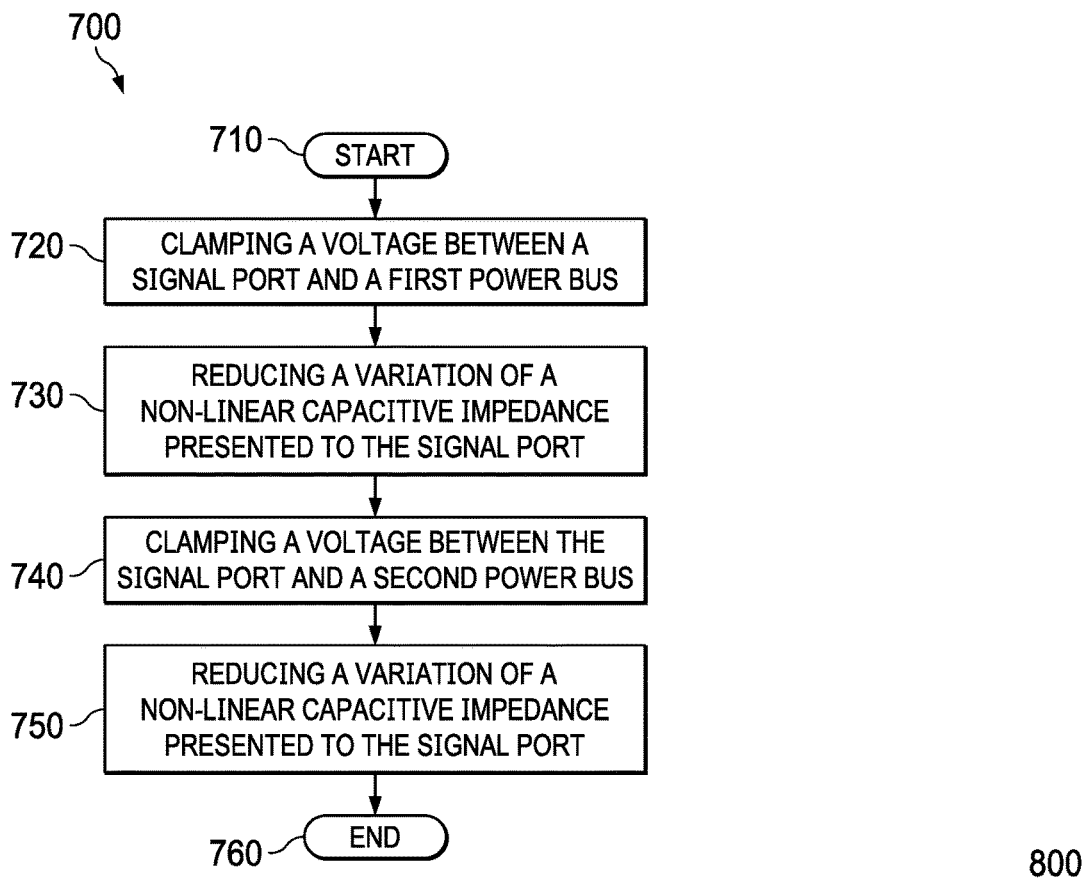
FIG. 7 illustrates a flow diagram of an example of a method of operating a protection circuit.

Turning now to FIG. 7 and with continuing reference to FIGS. 2 and 3, illustrated is a flow diagram of a method 700 of operating a protection circuit 200. The protection circuit 200 is coupled to a signal port I/O, and first and second power buses VSS, VDD for a signal processor (such as the signal processor 110 of FIG. 1). The method begins at start step 710. At step 720, the method 700 includes clamping a voltage between the signal port I/O and the first power bus VSS with a first diode string 210 coupled thereacross. The first diode string 210 includes a first diode D1 and a second diode D2 coupled in series in a same polarity sense. At step 730, the method 700 includes reducing a variation of a non-linear capacitive impedance presented to the signal port I/O (e.g., from the first and second diodes D1, D2) with a third diode D3 coupled in parallel with one of the first diode D1 and the second diode D2 in an opposite polarity sense.

The third diode D3 may be coupled in parallel with the second diode D2 with a first terminal 240 of the third diode D3 coupled to a common terminal 260 between the first diode D1 and the second diode D2 of the first diode string 210, and a second terminal 250 of the third diode D3 couplable to the signal port I/O. The third diode D3 may alternatively be coupled in parallel with the first diode D1 with a first terminal 240 of the third diode D3 couplable to the first power bus VSS and a second terminal 250 of the third diode D3 coupled to a common terminal 260 between the first diode D1 and the second diode D2 of the first diode string 210.

At step 740, the method 700 includes clamping a voltage between the signal port I/O and the second power bus VDD with a second diode string 310 coupled thereacross. The second diode string 310 includes a fourth diode D4 and a fifth diode D5 coupled in series in a same polarity sense. At step 750, the method 700 includes reducing a variation of the non-linear capacitive impedance presented to the signal port I/O (e.g., from the fourth and fifth diodes D4, D5) with a sixth diode D6 coupled in parallel with one of the fourth diode D4 and the fifth diode D5 in an opposite polarity sense.

The sixth diode D6 may be coupled in parallel with the fourth diode D4 with a first terminal 340 of the sixth diode D6 coupled to a common terminal 360 between the fourth diode D4 and the fifth diode D5 of the second diode string 310 and a second terminal 350 of the sixth diode D6 couplable to the signal bus I/O. The sixth diode D6 may alternatively be coupled in parallel with the fifth diode D5 with a first terminal 340 of the sixth diode D6 couplable to the second power bus VDD, and a second terminal 350 of the sixth diode D6 coupled to a common terminal 360 between the fourth diode D4 and the fifth diode D5 of the second diode string 310. The method 700 ends at end step 760.

Figure 8:
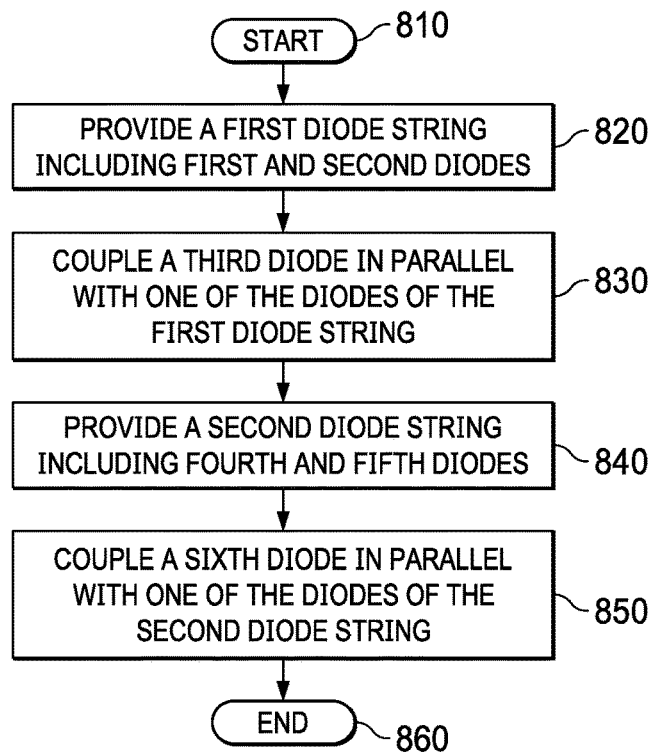
FIG. 8 illustrates a flow diagram of an example of a method of forming a protection circuit.

Turning now to FIG. 8 and with continuing reference to FIGS. 2 and 3, illustrated is a flow diagram of a method 800 of forming a protection circuit 200. The protection circuit 200 is coupled to a signal port I/O, and first and second power buses VSS, VDD for a signal processor (such as signal processor 110 of FIG. 1). The method begins at start step 810. At step 820, the method 800 includes providing a first diode string 210 couplable across the signal port I/O and the first power bus VSS. The first diode string 210 includes a first diode D1 and a second diode D2 coupled in series in a same polarity sense. At step 830, the method 800 includes coupling a third diode D3 in parallel with one of the first diode D1 and the second diode D2 in an opposite polarity sense.

The third diode D3 may be coupled in parallel with the second diode D2 with a first terminal 240 of the third diode D3 coupled to a common terminal 260 between the first diode D1 and the second diode D2 of the first diode string 210, and a second terminal 250 of the third diode D3 couplable to the signal bus I/O. The third diode D3 may alternatively be coupled in parallel with the first diode D1 with a first terminal 240 of the third diode D3 couplable to the first power bus VSS, and a second terminal 250 of the third diode D3 coupled to a common terminal 260 between the first diode D1 and the second diode D2 of the first diode string 210. The first diode string 210 and the third diode D3 may be located on the monolithic semiconductor substrate (element 130 of FIG. 1).

At step 840, the method 800 also includes providing a second diode string 310 couplable across the signal port I/O and the second power bus VDD. The second diode string 310 includes a fourth diode D4 and a fifth diode D5 coupled in series in a same polarity sense. At step 850, the method 800 also includes coupling a sixth diode D6 in parallel with one of the fourth diode D4 and the fifth diode D5 in an opposite polarity sense.

The sixth diode D6 may be coupled in parallel with the fourth diode D4 with a first terminal 340 of the sixth diode D6 coupled to a common terminal 360 between the fourth diode D4 and the fifth diode D5 of the second diode string 310, and a second terminal 350 of the sixth diode D6 couplable to the signal bus I/O. The sixth diode D6 may alternatively be coupled in parallel with the fifth diode D5 with a first terminal 340 of the sixth diode D6 couplable to the second power bus VDD, and a second terminal 350 of the sixth diode D6 coupled to a common terminal 360 between the fourth diode D4 and the fifth diode D5 of the second diode string 310. The first diode string (210), the third diode D3, the second diode string (310) and the sixth diode D6 may be located on the monolithic semiconductor substrate (element 130 of FIG. 1).

Thus, a protection circuit for a signal processor, a method of operating the protection circuit, and a method of forming the protection circuit, has been introduced. It should be understood that the previously described examples of the protection circuit, and related methods, are submitted for illustrative purposes only and that other examples capable of reducing the effects of unwanted signals on signal ports are well within the broad scope of the present disclosure. Additionally, in an advantageous example, the protection circuit may be embodied on a monolithic substrate with the signal processing circuit. Alternatively, the protection circuit may be a discrete component to protect the signal processing circuit.

Additionally, examples of the present disclosure have been illustrated with reference to specific electrical components. The components may be substituted (not necessarily with components of the same type) to create desired conditions or accomplish desired results. For instance, multiple components may be substituted for a single component and vice-versa. The principles of the present disclosure may be applied to a wide variety of signal processing circuits.

Although the present disclosure has been described in detail, various changes, substitutions and alterations may be made without departing from the spirit and scope of the disclosure in its broadest form.

Moreover, the scope of the present application is not intended to be limited to the particular examples of the process, machine, manufacture, composition of matter, means, methods and steps described in the specification. The processes, machines, manufacture, compositions of matter, means, methods, or steps, presently existing or later to be developed, that perform substantially the same function or achieve substantially the same result as the corresponding examples described herein may be utilized according to the present disclosure. Accordingly, the appended claims are intended to include within their scope such processes, machines, manufacture, compositions of matter, means, methods, or steps.

What is claimed is:

1. A protection circuit couplable to a signal port and a first power bus for a signal processor, comprising:
    a diode circuit including no greater than six diodes between a first power node couplable to a first power bus and a second power node connected to a second power bus, the diode circuit having an input-output (I/O) node couplable to the signal port, the diode circuit including:
        a first diode string connected to the first power node and to the I/O node, the first diode string including a first diode and a second diode coupled in series in a same polarity sense and connected at a first common terminal; and a third diode having first and second terminals and connected at the first common terminal in parallel with one of the first diode and the second diode in an opposite polarity sense, the first terminal connected only to the common terminal and the second terminal connected only to the first power bus or the I/O node; and a second diode string connected to the second power node and to the I/O node, the second diode string including a fourth diode and a fifth diode coupled in series in a same polarity sense and connected at a second common terminal; and a sixth diode having third and fourth terminals and connected at the second common terminal in parallel with one of the fourth diode and the fifth diode in an opposite polarity sense, the third terminal connected only to the common terminal and the fourth terminal connected only to the first power bus or the I/O node.

2. The protection circuit as recited in claim 1 wherein the third diode is coupled in parallel with the second diode, the first terminal coupled to the common terminal and a second terminal couplable to the signal bus.

3. The protection circuit as recited in claim 1 wherein the third diode is coupled in parallel with the first diode, the first terminal couplable to the first power bus and the second terminal coupled to the common terminal.

4. The protection circuit as recited in claim 1 wherein the signal port is an input/output port for the signal processor.

5. The protection circuit as recited in claim 1 wherein the first diode string and the third diode are located on a monolithic semiconductor substrate.

6. The protection circuit as recited in claim 1 wherein the first power bus is at one of a ground voltage, a positive voltage, and a negative voltage.

7. The protection circuit as recited in claim 1 wherein the sixth diode is coupled in parallel with the fourth diode, the third terminal coupled to the common terminal and the fourth terminal couplable to the signal port.

8. The protection circuit as recited in claim 1 wherein the sixth diode is coupled in parallel with the fifth diode, the fourth terminal couplable to the second power bus and the third terminal coupled to the common terminal.

9. The protection circuit as recited in claim 1 wherein the first diode string, the third diode, the second diode string and the sixth diode are located on a monolithic semiconductor substrate.

10. The protection circuit as recited in claim 1 wherein the first power bus is at a first voltage, the second power bus is at a second voltage, and the signal port is at a nominal voltage therebetween.

11. A method of forming a protection circuit couplable to a signal port and a first power bus for a signal processor, comprising:

providing a diode circuit including no greater than six diodes between a first power node couplable to a first power bus and a second power node couplable to a second power bus, the diode circuit having an I/O node couplable to the signal port, the diode circuit including:

a first diode string connected to the first power node and to the I/O node, the first diode string including a first diode and a second diode coupled in series in a same polarity sense and connected at a first common terminal;

a third diode having first and second terminals and connected at the first common terminal in parallel with one of the first diode and the second diode in an opposite polarity sense, the first terminal connected only to the common terminal and the second terminal connected only to the first power bus or the I/O node;

a second diode string connected to the second power node and to the I/O node, the second diode string including a fourth diode and a fifth diode coupled in series in a same polarity sense and connected at a second common terminal; and a sixth diode having third and fourth terminals and connected at the second common terminal in parallel with one of the fourth diode and the fifth diode in an opposite polarity sense, the third terminal connected only to the common terminal and the fourth terminal connected only to the first power bus or the I/O node.

12. The method as recited in claim 11 wherein the third diode is coupled in parallel with the second diode, the first terminal coupled to the common terminal and the second terminal couplable to the signal bus.

13. The method as recited in claim 11 wherein the third diode is coupled in parallel with the first diode, the second terminal couplable to the first power bus and the first terminal coupled to the common terminal.

14. The method as recited in claim 11 wherein the first diode string and the third diode are located on a monolithic semiconductor substrate.

15. The method as recited in claim 11 wherein the sixth diode is coupled in parallel with the fourth diode, the sixth diode having a first terminal coupled to a common terminal between the fourth diode and the fifth diode of the second diode string and a second terminal couplable to the signal port.

16. The method as recited in claim 11 wherein the sixth diode is coupled in parallel with the fifth diode, the sixth diode having a first terminal couplable to the second power bus and a second terminal coupled to a common terminal between the fourth diode and the fifth diode of the second diode string.

17. The method as recited in claim 11 wherein the first diode string, the third diode, the second diode string and the sixth diode are located on a monolithic semiconductor substrate.

18. A protection circuit, comprising:

a first circuit node couplable to a first power bus and a second circuit node couplable to a second power bus;

an input/output (I/O) node between the first circuit node and the second circuit node, the I/O node being couplable to a signal port of a signal processor;

a diode network having no more than six diodes between the first and second circuit nodes, the diode network including:

first, second and third diodes connected between the I/O node and the first power bus:

an anode of the first diode connected to the I/O node and a cathode of the first diode connected to an anode of the second diode;

a cathode of the second diode connected to the first power bus;

a cathode of the third diode connected to the I/O bus and an anode of the third diode connected to the cathode of the first diode; and fourth, fifth and sixth diodes connected between the I/O node and the second power bus:

a cathode of the fourth diode connected to the I/O node and an anode of the fourth diode connected to a cathode of the fifth diode;

an anode of the fifth diode connected to the second power bus; and an anode of the sixth diode connected to the I/O bus and a cathode of the sixth diode connected to the anode of the fourth diode.

19. A protection circuit, comprising:

a first circuit node couplable to a first power bus and a second circuit node couplable to a second power bus;

an input/output (I/O) node between the first circuit node and the second circuit node, the I/O node being couplable to a signal port of a signal processor;

a diode network having no more than six diodes between the first and second circuit nodes, the diode network including:

first, second and third diodes connected between the I/O node and the first power bus:
- an anode of the first diode connected to the I/O node and a cathode of the first diode connected to an anode of the second diode;
- a cathode of the second diode connected to the first power bus;
- an anode of the third diode connected to the first power bus and a cathode the third diode connected to the cathode of the first diode; and fourth, fifth and sixth diodes connected between the I/O node and the second power bus:
- a cathode of the fourth diode connected to the I/O node and an anode of the fourth diode connected to a cathode of the fifth diode;
- an anode of the fifth diode connected to the second power bus; and
- an cathode of the sixth diode connected to the second power bus and an anode of the sixth diode connected to the anode of the fourth diode.

* * * * *